United States Patent [19]

Sakai et al.

[11] Patent Number: 4,985,727
[45] Date of Patent: Jan. 15, 1991

[54] IMAGE RECORDING APPARATUS AND METHOD FOR RECORDING IMAGE

[75] Inventors: Jun Sakai; Mitsuru Ohta, both of Nagoya, Japan

[73] Assignee: Brother Kogyo Kabushiki Kaisha, Aichi, Japan

[21] Appl. No.: 404,775

[22] Filed: Sep. 9, 1989

[30] Foreign Application Priority Data

Sep. 12, 1988 [JP] Japan .............................. 63-277852

[51] Int. Cl.$^5$ ............................................. G03B 27/32
[52] U.S. Cl. ...................................... 355/27; 355/100; 355/326
[58] Field of Search ................... 355/27, 28, 212, 213, 355/326, 327, 32, 35, 100

[56] References Cited

U.S. PATENT DOCUMENTS

| | | | |
|---|---|---|---|
| 4,760,426 | 7/1988 | Taniguchi et al. | 355/27 |
| 4,772,922 | 9/1988 | Kawahara et al. | 355/32 |
| 4,841,338 | 6/1989 | Suzuki | 355/27 |

Primary Examiner—L. T. Hix
Assistant Examiner—D. Rutledge
Attorney, Agent, or Firm—Oliff & Berridge

[57] ABSTRACT

An image recording apparatus having a first exposure unit for forming a latent image corresponding to an original image on a photosensitive pressure sensitive recording medium, and a second exposure unit for electrostatically forming a developer particle image. The developer particle image is transferred onto the photosensitive pressure sensitive recording medium, and the thus transferred developer particles are reacted with chromogenic material of the photosensitive recording medium at a pressure developing unit so that a visible image is provided on another sheet medium. A method for recording the image includes the steps of effecting a first exposure for forming the latent image, effecting a second exposure for forming the developer particle image, electrostatically transferring the developer particle image onto the recording medium, and pressure developing the image to provide a visible image on a separate plane paper.

8 Claims, 1 Drawing Sheet

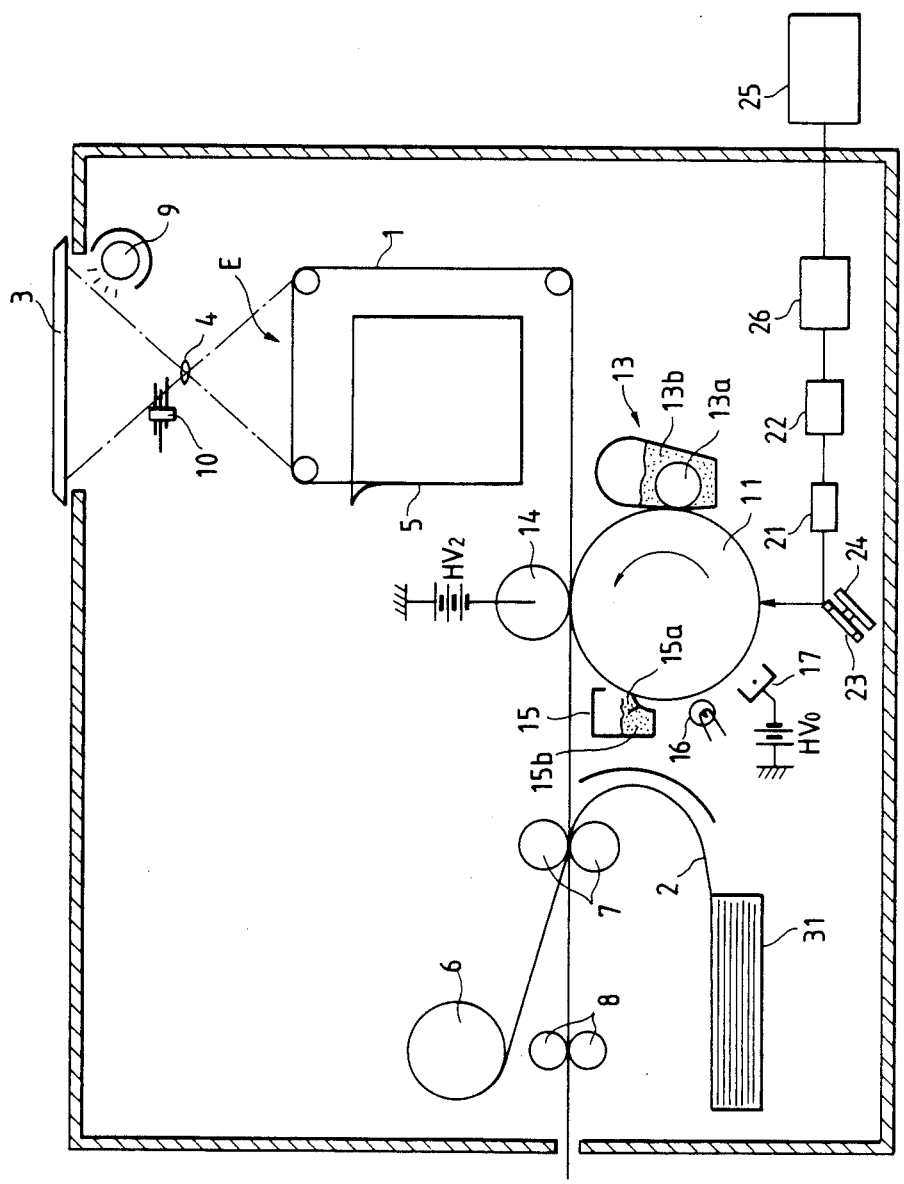

IMAGE RECORDING APPARATUS AND METHOD FOR RECORDING IMAGE

BACKGROUND OF THE INVENTION

The present invention relates to an image recording apparatus and a method for recording an image for recording an output image on a random sheet. More particularly, the invention relates to the apparatus end the method in which developer particles are applied onto a photosensitive recording medium which carries a latent image, and the developer particles are transferred onto the random sheet for providing the output image thereon.

Conventional transfer type image recording mediums are disclosed in Japanese Pat. application Kokai Nos. 61137749, 61-143738, and 61-173981. In the recording mediums, prepared is photosensitive pressure sensitive recording medium and a developer medium which is on market by a paper manufacturing company. The developer medium carries a developer material. The photosensitive pressure sensitive recording medium carries microcapsules which encapsulete therein chromogenic material or dye precursor. These microcapsules are photo cured upon light irradiation and the light exposed microcapsules have increased mechanical strength, whereas the non-exposed microcapsules have low mechanical strength so that the latter can be ruptured upon pressure.

The photosensitive pressure sensitive recording medium is subjected to light exposure to provide a latent image thereon, and the recording medium is superposed with the developer medium and undergoes pressure developing operation. Therefore, the microcapsules having low mechanical strength are ruptured during the pressure developing operation, so that the chromogenic material flows from the microcapsules to react with the developer material, whereupon an output image is provided on the developer medium.

The developer medium is prepared by dispersing the developer materials in an aqueous solution and coating the dispersed solution on a random sheet medium. Therefore, the developer medium requires a base substrate for making the developer material layer thereon. Further, it would be difficult to coat the dispersed aqueous solution onto a specific portion of the base substrate by means of a wet type coating method in view of the maintenance to the coating machine.

Further, in the case where an original image has a pure white color, it would be rather difficult to obtain a pure white color output image, since the developer materials are uniformly provided on the developer medium, and minute chromogenic reaction may occur between the microcapsules on the photosensitive recording medium and the developer materials.

SUMMARY OF THE INVENTION

It is therefore, an object of the present invention to overcome the above-described drawbacks and to provide an improved image recording apparatus which can save developer materials, and which can provide an inherent color of random sheet at position where no output image is provided.

Another object of the invention is to provide such improved image recording apparatus which can apply developer materials only at an imaging area by electrostatically applying the developer materials onto a portion of photosensitive recording medium which portion carries a latent image.

These and other objects of the invention can be attained by providing an image recording apparatus for recording an output image on a sheet medium, the output image corresponding to an image of an original, the apparatus using a photosensitive pressure sensitive recording medium having a surface which carries microcapsules encapsulating therein a chromogenic material, the apparatus comprising: a first exposure unit for exposing the photosensitive pressure sensitive recording medium to light for forming a latent image thereon corresponding to the image of the original, a second exposure unit for electrostatically forming a developer particle image, a transferring means for electrostatically transferring the developer particle image onto the photosensitive pressure sensitive recording medium carrying the latent image thereon, and a pressure developing unit disposed downstream of the transferring means for generating chromogenic reaction between the chromogenic material and the developer particles to provide the output image on the sheet medium.

In another aspect of the invention, there is provided a method for recording an output image on a sheet medium, the output image corresponding to an image of an original, the method using a photosensitive pressure sensitive recording medium having a surface which carries microcapsules encapsulating therein a chromogenic material, the method comprising the steps of, performing a first exposure for exposing the photosensitive pressure sensitive recording medium to light for forming a latent image thereon corresponding to the image of the original, performing a second exposure for electrostatically forming a developer particle image, electrostatically transferring the developer particle image onto the photosensitive pressure sensitive recording medium carrying the latent image thereon, and pressure developing the latent image for generating a chromogenic reaction between the chromogenic material and the developer particles to provide the output image on the sheet medium.

The developer particle image can be formed on the photosensitive pressure sensitive recording medium which has been provided with the latent image by the first exposure unit. The medium is brought into intimate contact with the sheet medium, and these are pressed together, so that the visualized image provided by the chromogenic reaction between the chromogenic material and the developer material is formed on the sheet medium.

Commonly assigned copending U.S Pat. application Ser. No. 335,492 filed on Apr. 10, 1989 discloses an image recording apparatus which applies developer particles onto one of the photosensitive recording medium and the opponent sheet.

BRIEF DESCRIPTION OF THE DRAWINGS

In the drawings:

The single drawing is a schematic cross-sectional elevation showing an image recording apparatus according to one embodiment of this invention.

DETAILED DESCRIPTION OF THE PREFERRED EMBODIMENT

An image recording apparatus according to one embodiment of this invention provides a first exposure unit for producing latent image on photosensitive pressure sensitive recording medium 1 and a second exposure unit for producing a developer particle image on a photosensitive drum 11. As described above, the photosensitive pressure sensitive recording medium 1 carries microcapsules a part of which is light exposed to cause photo curing of the microcapsules, and remaining part is non-exposed, to thereby provide the latent image corresponding to an image of an original 3.

The first exposure unit includes a light source a filter unit 10 and a focusing lens 4. A rolled photosensitive pressure sensitive recording medium 1 is stored in a cartridge 5 whose upper portion defines an exposure zone E. The light from the light source 9 is irradiated to the original 3 and is reflected therefrom. The reflected light passes through a filter of the filter unit 10 and the focusing lens 4, and is irradiated on the recording medium 1 on the exposure zone E. Therefore, the latent image corresponding to the image of the original is provided on the medium 1.

A drive means (not shown) is provided for moving the original, so that a line-slitting exposure is carried out onto the photosensitive recording medium 1 while also moving the latter. The filter unit 10 includes red, green and blue filters so as to effect color correction due to difference in sensitivity of the photosensitive pressure sensitive recording medium 1 and in spectral irradiation amount of the light source 9. The focusing lens 4 has variable focusing magnitude. In response to the change in magnification, the exposure scanning speed is varied with respect to the original 3, so that size of the focusing image on the recording medium 1 can be varied.

On the other hand, the second exposure unit is adapted to provide a developer particle image corresponding to the image of the original onto a photosensitive drum 11. The second exposure unit includes an image scanner 25 for reading imaging information as to the original image, a memory unit 26 connected to the image scanner 25 for storing the imaging information, a laser beam control circuit 22 connected to the memory unit 26 for controlling ON/OFF operation to a laser beam source 2 1 which applies the imaging information onto an outer peripheral surface of the photosensitive drum 11. A polygon mirror 23 and a scanner motor 24. The light from the polygonal mirror 23 is irradiated onto the photosensitive drum 11 for scanning exposure, since the polygon mirror 23 is rotated by the scanner motor 24. As a result of the exposure, an electrostatic latent image is formed on the drum by an electrostatic contrast between its unexposed portion and its exposed portion.

Transferring means is provided for transferring a developer particle image on the photosensitive drum 11 onto the photosensitive recording medium 1. The transferring means includes developer developing unit 13 accumulating therein developer particles 13b, a transfer roller 14, a cleaning unit 15, an electricity remover 16 and a charger 17 connected to a high voltage source HVo arranged in order in g counterclock-wise direction in the Figure. The developer developing unit electrostatically applies the developer particles 13b at a portion corresponding to the electrostatic latent image on the drum 11 means of a developing sleeve 13a. The transfer drum 14 is connected to a negative high voltage HV2 and is adapted to transfer the developer particle image on the drum 11 to the photosensitive pressure sensitive recording medium The cleaning unit 15 has a cleaning blade 15a for recovering the residual developer particles on the drum 11. Therefore, residual developer particles 15b can be accumulated In the cleaner 15. The electricity remover 16 is adapted to remove residual electrical charge on the drum 11, and the charger 17 is adapted to uniformly apply electrical charge over the drum 11.

At a downstream side of the exposure units, there are provided a pressure developing unit 7 and a sheet cassette 31. The sheet cassette 31 supplies a random sheet such as an ordinary plain paper 2 to an inlet portion of the pressure developing unit 7, where the paper 2 and the photosensitive pressure sensitive recording medium are superposed with each other and pressed by pressure rollers. Consequently, a visible image is formed on the paper 2.

At the downstream side of the pressure developing unit, there is provided a thermal fixing roller 8 for fixing an output image on the paper 2. Further, the photosensitive pressure sensitive recording g medium is taken-up by a takeup roller 6.

In operation, in the first exposure unit, the latent image corresponding to the image on the original is formed on the photosensitive pressure sensitive recording medium 1 at the exposure zone E. In this exposure, the light exposed microcapsules are photocured whereas non-light exposed microcapsules are not photocured.

On the other hand, in the electrophotographic type exposure unit, in response to the rotation of the photosensitive drum 11, residual electrical charge on the drum 11 is removed by the remover 16, and the drum 11 is uniformly charged by the charger 17. Digital information indicative of exposure and non-exposure is transmitted from the laser beam control unit 22 to the laser beam source 21, so that the latter generates a laser beam having single wavelength. The laser beam is reflected at the polygonal mirror 23 and the beam is irradiated onto the photosensitive drum 11 for scanning exposure. As a result of the exposure, an electrostatic latent image is formed on the drum 11 by an electrostatic contrast between its unexposed portion and its exposed portion.

The developing bias is applied to the developing sleeve 13a of the developer developing unit 13 so that the developer particles are electrostatically attracted to the non-exposed part on the photosensitive drum 1 on which electrostatic latent image has been provided. Accordingly, a visible developer particle image is formed on the photosensitive drum 11. The visible particle image is then transferred onto the photosensitive pressure sensitive recording medium 1 by the transfer roller 14 to which the negative high voltage HV2 is applied. The cleaning blade 15a recovers the residual developer particles 15b from the outer peripheral surface of the drum 11.

Thus, the photosensitive pressure sensitive recording medium 1 has the latent image formed at the first exposure unit as well as another image formed of the developer particles produced at the second exposure unit. Such medium 1 is superposed with the random sheet delivered from the sheet cassette 31, and the two sheets are pressed together at the pressure developing unit 7. Therefore, the nonexposed microcapsules are ruptured and the encapsulated chromogenic materials are flowed out of the microcapsules to react with the developer particles. Consequently, a colored output image is provided on the sheet 2. The sheet 2 is further travelled through the thermal fixing unit 8 for image fixing, whereas the used photosensitive pressure sensitive recording medium is taken up by the take up roller 6.

As described above, according to the present invention, the developer particles are only applied to the potential imaging area on the photosensitive pressure sensitive recording medium. Therefore, consumption of the developer particles can be minimumly maintained. Further, since the portion of the photosensitive sheet that does not require coloring is not subjected to developer particle reception/inherent color of the sheet 2 can be used as a background color.

While the invention has been described in detail and with reference to specific embodiment thereof, it would be apparent for those skilled in the art that various changes and modifications can be made therein without departing from the spirit and scope of the invention.

What is claimed is:

1. An image recording apparatus for recording an output image on a sheet medium, the output image corresponding to an image of an original, the apparatus using a photosensitive pressure sensitive recording medium having a surface which carries microcapsules encapsulating therein a chromogenic material, the apparatus comprising:
   a first exposure unit for exposing the photosensitive pressure sensitive recording medium to light for forming a latent image thereon corresponding to the image of the original;
   a second exposure unit for electrostatically forming a developer particle image;
   a transferring means for electrostatically transferring the developer particle image onto the photosensitive pressure sensitive recording medium carrying the latent image thereon; and
   a pressure developing unit disposed downstream of the transferring means for generating a chromogenic reaction between the chromogenic material and the developer particles to provide the output image on the sheet medium. wherein the developer particle image corresponds to the latent image on the photosensitive pressure sensitive recording medium.

2. The image recording apparatus as claimed in claim 1, wherein the developer particle image corresponds to the latent image on the photosensitive pressure sensitive recording medium.

3. The image recording apparatus as claimed in claim 1, wherein the second exposure unit comprises a photosensitive drum, a laser beam source which applies a laser beam to the photosensitive drum, and a laser beam controlling means for controlling the laser beam in accordance with an image information obtained from the image of the original.

4. The image recording apparatus as claimed in claim 3, further comprising a thermal fixing unit disposed downstream of the pressure developing unit for fixing the output image on the sheet medium.

5. The image recording apparatus as claimed in claim 1, wherein the sheet medium comprises a plain paper.

6. The image recording apparatus as claimed in claim 1, wherein the chromogenic material generates a color upon reaction with the developer particles in accordance with ruptures of the microcapsules.

7. A method for recording an output image on a sheet medium, the output image corresponding to an image of an original, the method using a photosensitive pressure sensitive recording medium having a surface which carries microcapsules encapsulating therein a chromogenic material, the method comprising the steps of:
   performing a first exposure for exposing the photosensitive pressure sensitive recording medium to light for forming a latent image &hereon corresponding to the image of the original;
   performing a second exposure for electrostatically forming a developer particle image;
   electrostatically transferring the developer particle image onto the photosensitive pressure sensitive recording medium carrying the latent image thereon; and
   pressure developing the latent image for generating a chromogenic reaction between the chromogenic material and the developer particles to provide the output image on the sheet medium.

8. The method as claimed in claim 7, wherein the second exposure step generates the developer particle image corresponding to the latent image.

* * * * *